(12) United States Patent
Bae

(10) Patent No.: US 6,343,040 B2
(45) Date of Patent: Jan. 29, 2002

(54) AUTO PRECHARGE CONTROL SIGNAL GENERATING CIRCUITS FOR SEMICONDUCTOR MEMORY DEVICES AND AUTO PRECHARGE CONTROL METHODS

(75) Inventor: Yong Cheol Bae, Songpa-ku (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/792,421

(22) Filed: Feb. 23, 2001

(30) Foreign Application Priority Data

Feb. 24, 2000 (KR) .............................................. 00-9178

(51) Int. Cl.[7] ................................................ G11C 7/00
(52) U.S. Cl. ........................ 365/203; 365/233; 365/194
(58) Field of Search ........................... 365/203, 230.03, 365/233, 194

(56) References Cited

U.S. PATENT DOCUMENTS

| 5,748,560 A | 5/1998 | Sawada | 365/233 |
| 6,023,436 A | 2/2000 | Han | 365/203 |
| 6,026,035 A | 2/2000 | Kim | 365/190 |
| 6,081,468 A | * | 6/2000 | Taira et al. | 365/203 |
| 6,215,709 B1 | * | 4/2001 | Wright et al. | 365/194 |

* cited by examiner

Primary Examiner—Huan Hoang
(74) Attorney, Agent, or Firm—Myers Bigel Sibley & Sajovec

(57) ABSTRACT

An auto precharge control signal generating circuit includes an output enable circuit that is reset in response to a precharge operation and generates an output enable signal by latching an auto precharge command signal. A delay circuit also is provided which generates a 1 clock delay signal by delaying an active period of a column bank address signal by 1 clock, and generates a 1 clock delay signal having an active period including a non-active period sufficiently between a previous column bank address signal and a present column bank address signal in case that the burst length is 1. A combining circuit generates an auto precharge control signal by combining the column bank address signal and the 1 clock delay signal in response to the output enable signal, in order to perform the auto precharge operation after delaying 2 clock from the last data input in response to a continued auto precharge burst write command. Therefore, when the burst length is 1 in case that the time from the last data input to the auto precharge is 2 clock cycles in burst write, the present invention prevents the generation of unnecessary auto precharge control signal resulting from the crossing of the 1 clock delay signal and the column bank address signal in the middle of continuous burst write operation.

8 Claims, 2 Drawing Sheets

AUTO PRECHARGE CONTROL SIGNAL GENERATING CIRCUITS FOR SEMICONDUCTOR MEMORY DEVICES AND AUTO PRECHARGE CONTROL METHODS

RELATED APPLICATION

This application is related to Korean Application No. 2000-9178, filed Feb. 24, 2000, the disclosure of which is hereby incorporated herein by reference.

FIELD OF THE INVENTION

The present invention relates to auto precharge control signal generating circuits for semiconductor memory devices and auto precharge control methods.

DESCRIPTION OF THE RELATED ART

Auto precharge burst write operations are performed in synchronous dynamic random access memory SDRAM devices. An auto precharge burst write operation is used to perform precharge automatically after a given time tRDL from the last data input, after writing data in an amount of the burst length given when inputting a write command. A SDRAM having auto precharge operation is disclosed in U.S. Pat. No. 5,748,560.

Generally, auto precharge operations delay a column bank address signal corresponding to the burst length by a fixed clock in response to tDRL, and generate an auto precharge control signal by combining the delayed signal and the column bank address signal. In case that tRDL is equal to 2 clock cycles, an auto precharge control signal has to be generated after 1 clock cycle from End of Burst (EOB) has passed. Therefore, a column bank address signal indicating an EOB is typically delayed by 1 clock cycle and is used in generating an auto precharge control signal.

In an auto precharge operation, an auto precharge is determined according to when a next column command after an initial column command is applied. For example, if a command is applied in the form of an interrupt, a column bank address signal is not disabled and thus the auto precharge information applied in an initial time is lost and the precharge operation is not generated. In case that a command is applied in the form of 1 clock gap, in a condition that tRDL is 2 clock cycles, because the last data is not written into a cell, the precharge time point is the same time point as a command applied later. Thus, in this case, it is desirable that the precharge operation is performed in the different manner from the above-mentioned manner.

In case that a gap between a column bank address signal and a 1 clock cycle delay signal is 1 clock cycle and a burst write command is applied to the 1 clock gap, a margin is assured by delaying so that the trailing edge of 1 clock delay signal is located behind a leading edge of the next column bank address signal. But, in case that the length of a burst is 1, a column bank address signal becomes active in applying a command and becomes inactive at the next clock. Therefore, in case a phenomenon that the trailing edge of the column bank address signal and the leading edge of the 1 clock delay signal do not overlap, an unwanted precharge control signal may be generated.

SUMMARY OF THE INVENTION

An object of the present invention is to provide auto precharge control signal generating circuits of a semiconductor memory device and an auto precharge control method which prevents the generation of unnecessary auto precharge control signals due to the crossing of a 1 clock delay signal and a column bank address signal in the middle of continuous burst write operation. This is achieved by setting the timing of the delay signal so that an active period of the 1 clock delay signal includes a sufficient gap between column bank address signals, when the burst length is 1 and the time from the last data input to an auto precharge is 2 clock cycles (in case that a burst write command is applied at intervals of 1 clock).

According to one aspect of the present invention, to accomplish the object, a circuit of a preferred embodiment includes output enable means which is reset in response to a precharge operation and generates an output enable signal by latching an auto precharge command signal in an active period of a column bank address signal. Delay means also is provided. The delay means generates a 1 clock delay signal by delaying the active period of the column bank address signal by 1 clock, and generates a 1 clock delay signal having an active period that sufficiently covers a non-active period between a previous column bank address signal and a present column bank address signal in the event the burst length is 1. Assembly means also is provided. The assembly means generates an auto precharge control signal by combining the column bank address signal and the 1 clock delay signal in response to the output enable signal. This auto precharge control signal controls auto precharge after delaying it 2 clock cycles from the input time point of the last data, in response to a continuous auto precharge burst write command.

The delay means includes input latch means, which is set by the column bank address signal and is reset by the output enable signal, and latch means which inputs an output signal of the input latch means at a falling edge of a clock signal and outputs at a rising edge of the clock signal. An auto pulse generation means also is provided which delays an output signal of the latch means so that a back part of a 1 clock delay signal (responding to a previous auto precharge burst write command) is located next to a front part of a column bank address signal (responding to a present auto precharge burst write command). The auto pulse generation means also generates the 1 clock delay signal by extending an active period of an output signal of the latch means so that the front part of a 1 clock delay signal is located before the back part of a column bank address signal, in case the burst length is 1.

The auto pulse generation means also may include a delayer that delays an output signal of the clock synchronous latch means for a fixed time, a switching means that switches an output signal of the latch means in response to a burst length 1, and a NAND gate that generates a 1 clock delay signal by combining an output signal of the delayer and an output signal of the switching means.

Also, an output enable means includes a switching means for switching an auto precharge command signal at a falling edge of a clock signal in an active period of the column address signal in response to the precharge operation. The output enable means also includes an inversion latch means that generates an output enable signal by latching an output signal of the switching means. Reset means also is provided for resetting the inversion latch means in response to the precharge operation. A combining means includes a NOR gate that receives the 1 clock delay signal and the column bank address signal, and a NAND gate that receives the output of the NOR gate and also receives the output enable signal.

An auto precharge control method can be performed during an auto precharge burst write operation. This method comprises the steps of generating a column bank address signal having an active period corresponding to burst length (during auto precharge burst write command), in response to a rising edge of a clock signal. The column bank address signal also is latched at a falling edge of a clock signal. The output enable signal also is generated by latching an auto precharge command signal at a falling edge of the clock signal, after input-latching the column bank address signal. The input-latched column bank address signal also is output latched at a rising edge of the next clock signal. The 1 clock delay signal also is generated by delaying the output-latched column bank address signal or generating a 1 clock delay signal having an active period including a non-active period sufficiently between the previous column bank address signal and the present column bank address signal in case the burst length is 1. These steps are repeated if there is a next continued auto precharge burst write command. Otherwise, an auto precharge control signal is generated which becomes active at an end part of the 1 clock delay signal and becomes non-active by the output enable signal.

The present invention can prevent the generation of an unwanted auto precharge control signal and makes it easy to design a delay circuit. The auto precharge control signal is generated by combining a column bank address signal having EOB information and a signal obtained by delaying the signal by 1 clock.

BRIEF DESCRIPTION OF THE DRAWINGS

Further objects and advantages of the invention can be more fully understood from the following detailed description taken in conjunction with the accompanying drawings in which.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
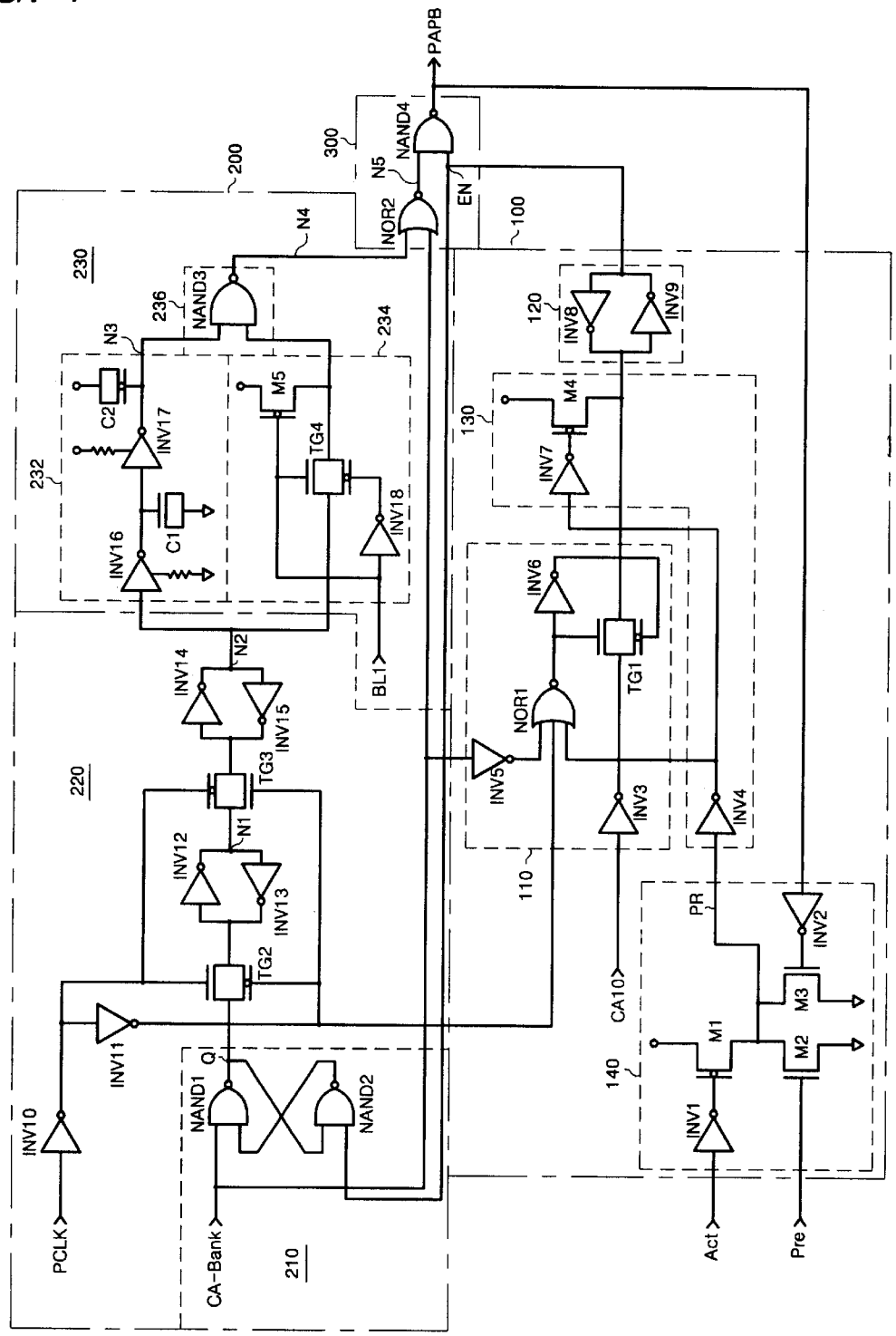
FIG. 1 is a circuit diagram of a preferred embodiment of an auto precharge control signal generating circuit of a semiconductor memory device by the present invention.

FIG. 1 illustrates a preferred embodiment of an auto precharge control signal generation circuit that can be used in a semiconductor memory device. In FIG. 1, a circuit of the present invention includes output enable means 100, a delay means 200 and combining means 300. The output enable means 100 is reset in response to a precharge operation and generates an output enable signal by latching an auto precharge command signal in an active period of a column bank address signal. The output enable means 100 includes a switching means 110 including inverters INV3, INV5 and INV6, a NOR gate NOR1 and a transmission gate TG1, an inversion latch means 120 including inverters INV8 and INV9, a reset means 130 including inverters INV4 and INV7 and a PMOS transistor M4 and a precharge reset signal generation means 140 including inverters INV1 and INV2 and MOS transistors M1~M3.

The switching means 110 inputs an auto precharge command signal CA10 through an inverter INV3 by opening a transmission gate TG1 in response to a falling edge of a clock signal PCLK in the high state of a precharge reset signal PR and in the high period. During an auto precharge command, CA10 maintains at high state. The signal latched by the inversion latch means 120 is provided as an output enable signal EN. The reset means 130 disables the output enable signal EN to a low state by resetting an input port to a high state in response to a low state of the precharge reset signal PR. The precharge reset signal generation means 140 renders a precharge reset signal to be in a disable state of a high state in response to an active command, renders to be in an enable state of a low state in response to a precharge signal Pre or auto precharge control signal PAPB.

Therefore, the output enable means 100 latches a signal of CA10 to render an output to be in an enable state after a column bank address signal is input to a delay means and is latched when a command is applied. The output enable state is disabled by a preset reset signal generation means 140 and a reset means 130 for the next operation after an auto precharge control signal is output.

The delay means 200 generates a 1 clock delay signal by delaying an active period of a column bank address signal by 1 clock, and generates a 1 clock delay signal having an active period including a non-active period sufficiently between the previous column bank address signal and the present column bank address signal in case that the burst length is 1.

The delay means 200 includes an input latch means 210, a clock synchronous latch means 220 and an auto pulse generation means 230. The input latch means 210 is an RS flip flop that comprises two NAND gates NAND1 and NAND2. CA_Bank is input as a set input of the RS flip flop, and an output enable signal EN is inputted as a reset input. Therefore, CA_Bank is inverted and is output at a positive output Q of the RS flip flop.

The clock synchronous latch means 220 latches a positive output signal of the RS flip flop to input latches INV12 and INV13 by turning on TG2 at a falling edge of a clock signal, and includes inverters INV10~INV15 and transmission gates TG2 and TG3. Then, the clock synchronous latch means 220 latches a signal latched to input latches to output latches INV14 and INV15 by turning on TG3 at a rising edge of the clock signal. Therefore, a signal being output from a node N2 is delayed by about 1 clock as compared with an input signal. The auto pulse generation means 230 delays an output signal of said clock synchronous latch means 220, so that a back pail of a 1 clock delay signal (responding to the previous auto precharge burst write command) is located after the front part of a column bank address signal (responding to the present auto precharge burst write command). Also, the auto pulse generation means 230 generates said 1 clock delay signal by extending an active period of an output signal of said clock synchronous latch means 220 so that the front part of a 1 clock delay signal is located prior to the back part of a column bank address signal when the burst length is 1. The auto pulse generation means 230 includes a delayer 232, a switching means 234 and a NAND gate 236 (NAND3).

The delayer 232 delays an input signal for a fixed time and comprises an inverter INV16 whose falling edge is delayed, an inverter INV17 whose rising edge is delayed and MOS capacitors C1 and C2.

The switching means 234 includes an inverter INV18, a transmission gate TG4 and a MOS transistor M5, and provides an input signal to an input terminal of one side (without delay) by turning on the transmission gate TG4 in an enable state of a burst length 1 signal BL1, and maintains the input terminal of one side at a high state by turning off the transmission gate TG4 and turning on the MOS transistor M5 in a mode that the burst length is not 1.

Therefore, according to a preferred aspect of the present invention, the NAND gate NAND3 outputs a delayed signal in a mode that the burst length is not 1, but outputs a 1 clock delay signal having an active period from the front part of an input signal to the back part of a delayed signal in case the burst length is 1.

The combining means 300 includes a NOR gate NOR2 that performs a NOR logic operation on a 1 clock delay signal and said column bank address signal CA—BANK, and a NAND gate NAND4 that performs a NAND logic operation on a signal at the output of the NOR gate NOR2 and said output enable signal EN. That is, in the combining means 300, the generation of an auto precharge control signal is suppressed because a front part of the next column bank address signal appears just before a back part of a 1 clock delay signal appears by performing a NOR logic operation on the 1 clock delay signal and the column bank address signal. Because there is no applying of the next command at the back part of the 1 clock delay signal generated in response to the application of the last command and there is no following column bank address signal, then an output of the NOR gate NOR2 is increased at a falling edge of the 1 clock delay signal. Because the 1 clock delay signal (having an active period including 1 clock gap determined by the above mentioned auto pulse generation means 230) is input to the NOR gate NOR2, the generation of an unwanted auto precharge control signal is blocked.

Thus, the present invention can prevent an auto precharge control signal from being generated at the middle, by compensating a front part margin of a 1 clock delay signal sufficiently in the auto pulse generation means in case that an auto precharge burst write command, whose burst length is 1, is applied with a 1 clock gap.

NAND gate NAND4 operates on an output signal of the NOR gate NOR2 and an output enable signal EN. That is, an output signal of the NOR gate NOR2 is output by maintaining a high state in an auto precharge mode, but the output of the NAND gate NAND4 maintains a non-active state of a high state by maintaining a low state in a reset mode.

Figure 2:
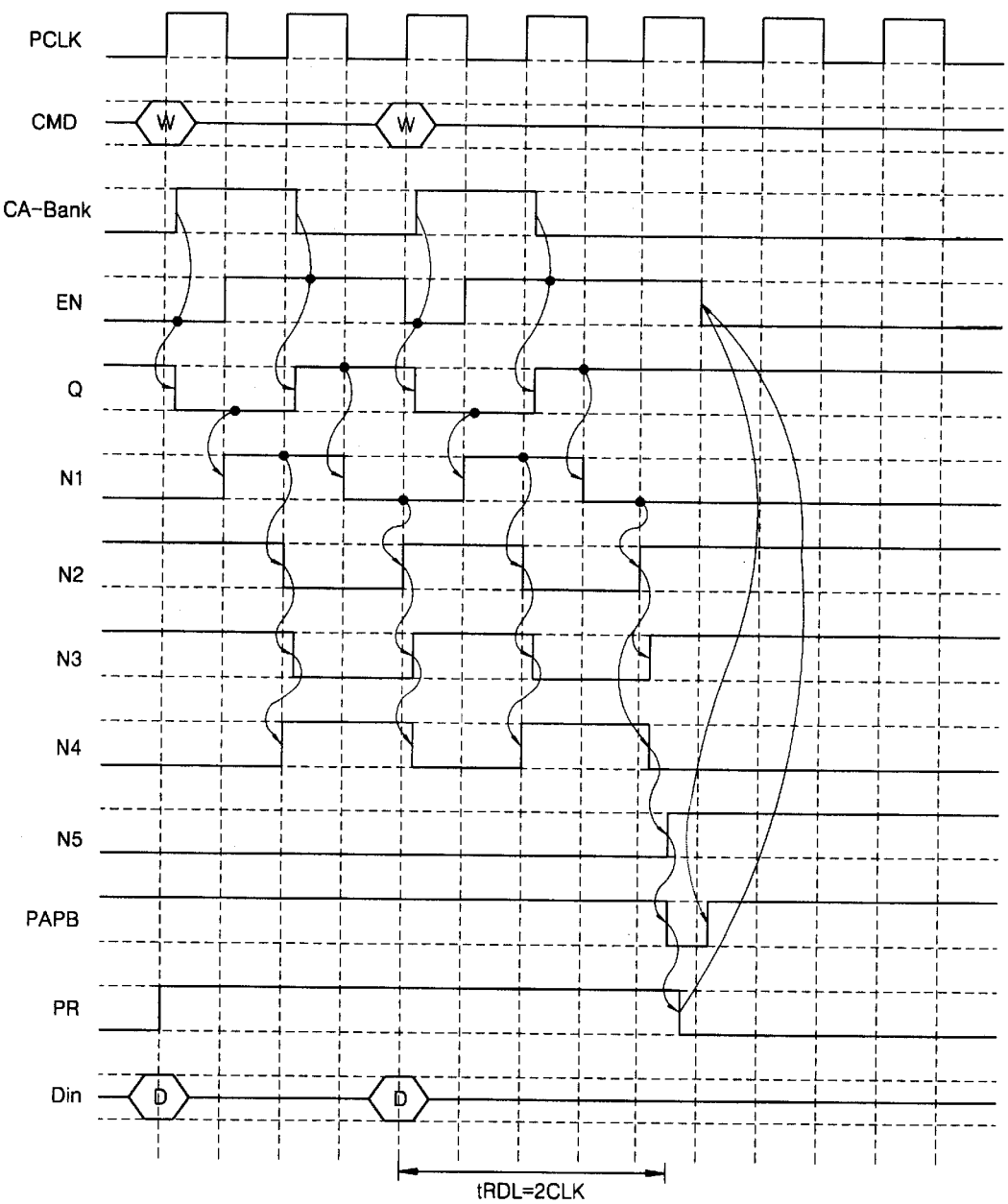
FIG. 2 is a timing diagram that illustrates operation of the circuit of FIG. 1.

The timing diagram of FIG. 2 illustrates operation of the device of FIG. 1.

As illustrated by FIG. 2, an auto precharge burst write command with burst length 1 is applied at a rising edge of a first clock. In the event the burst length is 1 and tRDL=2CLK, the length from data input to an end of burst EOB is determined to be 1 clock length and hereupon a column bank address signal having an active period of 1 clock is generated. At this time, the column bank address signal appears by being delayed a little from a clock rising edge. Because an output enable signal is in a non-active state, a positive output of the input latch means 210 is converted to a low state at a rising edge of the column bank address signal. Because the transmission gate TG2 is turned on at a falling edge of the first clock, the low state of the input latch means 210 is inverted to a high state and is latched at node N1.

Also, in the output enable means 100, because a transmission gate TG1 is turned on at a falling edge of the first clock, the high state of CA10 is inputted and latched to the inversion latch means 120, and therefore the output enable signal EN is converted from a low state to a high state and goes to an output enable state. Because the transmission gate TG2 is turned off and the transmission gate TG3 is turned on at a rising edge of a second clock, the high state of the node N1 is output and latched to a node N2 as a low state. Therefore, the front part of the column bank address signal is delayed about 1 clock when transferred to node N2.

But, because a signal latched to the node N2 is not delayed from the front part of the column bank address signal, but is generated by being synchronized to a clock edge, the signal latched to the node N2 is not delayed exactly 180 degrees. Therefore, if an auto precharge control signal is generated by combining the signal of node N2 and one of the column bank addresses, an unwanted auto precharge control signal is generated. In the event tRDL=2CLK, an auto precharge operation must be performed at the back part of the signal of node N2. But, if a burst write command is applied with a 1 clock gap continuously, the auto precharge operation of the front part is cancelled by the burst write command. That is, the generation of an auto precharge control signal is blocked. But, because the back part of the signal at node N2 and the front part of the next column bank address signal is not overlapped, the unwanted auto precharge control signal is generated. Therefore, in order to prevent such a problem, the signal at node N2 is delayed through the delayer 230 and is output by being delayed 180 degrees. That is, the delay property of the delayer 230 is designed in order that the back part of the signal at node N2 is overlapped with the front part of the next column bank address signal.

But, in designing the delay property of the delayer 230, if the delayer is designed to have a delay property with a sufficient margin (by considering the process condition and the thermal margin sufficiently), then the signal at node N3 is delayed too much. If this occurs, the back part of the column bank address signal is not overlapped with the front part of the signal of the node N3. This also generates an unwanted auto precharge control signal and results in an error in the operation.

The embodiment of the present invention is made so that the back part of a column bank address signal and the front part of the next column bank address signal are overlapped sufficiently at a front part and at a back part of a signal, by generating a signal at node N4 having an active period over 1 clock by combining the signal of the node N2 and the signal of node N3 in the event the burst length is 1. When the state of node N4 is converted to a low state after the last command is applied and 1 clock is passed from EOB, then the state of node N5 becomes a high state, and hereupon an auto precharge control signal PAPB is output in a low state. The low state of the auto precharge control signal PAPB renders a precharge reset signal to be in an active state through a precharge reset signal generation circuit 140. Therefore, the output enable signal is converted to a non-active state (a low state) when the reset means 130 is activated. Hereupon, the auto precharge control signal PAPB is converted from a low state to a high state and an active period of tPR is determined.

As has been stated, in a synchronous DRAM, where an auto precharge burst write command is applied continuously with 1 clock gap in a mode that tRDL=2CLK and the burst length is 1, the present invention can prevent the generation of an unwanted auto precharge control signal. This is achieved by generating an auto precharge control signal by combining a column bank address signal having EOB information and a signal obtained by delaying said signal by 1 clock.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An auto precharge control signal generation circuit of a semiconductor memory device, the circuit comprising:

output enable means that is reset in response to a precharge operation and generates an output enable signal by latching an auto precharge command signal in an active period of a column bank address signal;

delay means that generates a 1 clock delay signal by delaying the active period of the column bank address signal by 1 clock cycle, and generates the 1 clock delay signal having a longer active period, including a non-active period between a previous column bank address signal and a present column bank address signal, in the event the burst length is 1; and assembly means that generates an auto precharge control signal by combining the column bank address signal and the 1 clock delay signal in response to the output enable signal, in order to perform an auto precharge operation after delaying 2 clock cycles from the input time point of the last data generated in response to a continuous auto precharge burst write command.

2. The auto precharge control signal generation circuit of a semiconductor memory device according to claim 1, wherein said delay means comprises:

input latch means that is set by the column bank address signal and is reset by the output enable signal;

latch means that inputs an output signal of the input latch means at a falling edge of a clock signal and outputs the output signal at a rising edge of the clock signal; and auto pulse generation means that delays an output signal of said latch means so that a back part of a 1 clock delay signal responding to a previous auto precharge burst write command is located next to a front part of a column bank address signal responding to a present auto precharge burst write command, and generates the 1 clock delay signal by extending an active period of an output signal of said latch means so that the front part of a 1 clock delay signal is located before the back part of a column bank address signal in case the burst length is 1.

3. The auto precharge control signal generation circuit of a semiconductor memory device according to claim 2, wherein said auto pulse generation means comprises:

a delayer that delays an output signal of said latch means for a fixed time;

switching means that switches an output signal of said latch means in response to a burst length of 1; and a NAND gate that generates a 1 clock delay signal by performing a NAND operation on an output signal line of said delayer and an output signal of said switching means.

4. The auto precharge control signal generation circuit of a semiconductor memory device according to claim 1, wherein said output enable means comprises:

switching means that switches the auto precharge command signal at a falling edge of a clock signal in an active period of the column address signal, in response to the precharge operation;

an inversion latch means that generates the output enable signal by latching an output signal of said switching means; and a reset means that resets said inversion latch means in response to the precharge operation.

5. The auto precharge control signal generation circuit of a semiconductor memory device according to claim 1, wherein said combining means comprises:

a NOR gate that performs a NOR operation on the 1 clock delay signal and the column bank address signal; and a NAND gate that performs a NAND operation on an output signal of said NOR gate and the output enable signal.

6. A method of performing an auto precharge operation, comprising the steps of:

generating a column bank address signal having an active period corresponding to burst length, in response to an auto precharge burst write command and a rising edge of a clock signal;

input-latching the column bank address signal at a falling edge of the clock signal;

generating an output enable signal by latching an auto precharge command signal at a falling edge of the clock signal, after input-latching the column bank address signal;

output-latching the input-latched column bank address signal at a rising edge of the next clock signal; and generating a 1 clock delay signal by delaying the output-latched column bank address signal or generating a 1 clock delay signal having an active period including a non-active period sufficiently between the previous column bank address signal and the present column bank address signal in case the burst length is 1.

7. The method of claim 6, wherein a delay time of the 1 clock delay signal delays the output-latched column bank address signal so that a back part of a 1 clock delay signal, responding to a previous auto precharge burst write command, is located after a front part of a column bank address signal responding to a present auto precharge burst write command.

8. The method of claim 6, wherein the output enable signal is reset in response to an auto precharge control signal.

* * * * *